(12) United States Patent
DeFlorio

(10) Patent No.: US 7,439,727 B2
(45) Date of Patent: Oct. 21, 2008

(54) INTERLOCKING ELECTRICAL TEST PROBES

(76) Inventor: Ralph Emery DeFlorio, 202 Water St., P.O. Box 301, Hillsboro, IN (US) 47949

( * ) Notice: Subject to any disclaimer, the term of this patent is extended or adjusted under 35 U.S.C. 154(b) by 0 days.

(21) Appl. No.: 11/726,750

(22) Filed: Mar. 23, 2007

(65) Prior Publication Data

US 2008/0231259 A1    Sep. 25, 2008

(51) Int. Cl.
  *G01R 1/06*  (2006.01)

(52) U.S. Cl. ...................................... 324/149

(58) Field of Classification Search ................. 324/149
  See application file for complete search history.

(56) References Cited

U.S. PATENT DOCUMENTS

| 3,515,989 | A | * | 6/1970 | Palmer | 324/72.5 |
| 5,347,892 | A | * | 9/1994 | Moetteli | 81/177.85 |
| 2007/0187962 | A1 | * | 8/2007 | Park | 294/1.1 |

* cited by examiner

*Primary Examiner*—Ha Nguyen
*Assistant Examiner*—Shaun Campbell

(57) ABSTRACT

A pair of interlocking electrical test probes, each probe having an interlocking end which mates or can be easily joined together with the other's end such that the pair of test probes can be operable with one hand when their respective interlocking ends are joined together. The pair of interlocking electrical test probes also capable of being operated separately or independently, one in each hand when in the unjoined state. When joined together, the pair of interlocking electrical test probes are free to pivot about their interlocked or mated ends, thus allowing the distance between their contact points to be varied while being held in one hand, therefore freeing up an electrician's or technician's other hand to hold a meter, flashlight, schematic or for some other purpose.

2 Claims, 2 Drawing Sheets

INTERLOCKING ELECTRICAL TEST PROBES

BACKGROUND OF THE INVENTION

This invention relates to a set or pair of test probes which come into contact with electrical components, in order to carry electrical signals from test points in an electrical circuit to a measurement instrument such as a volt-ohm meter or VOM.

Test probes typically occur in pairs. One of them, normally red in color, the other normally black in color. Usually, a technician holds one probe in one hand and the other probe in the other hand in order to take a reading. This, unfortunately, occupies both hands of the technician leaving no spare hand to hold the volt-ohm meter or flashlight to assist in making sure of the correct contact points in the circuit or to hold the readout display of the volt-ohm meter for the optimum viewing angle for the technician. However, many times the two contact points are in close proximity, so that a technician could hold both probes in one hand if there were a secure way to do so, thus freeing up the other hand to hold the meter, a flashlight or electrical schematic diagram.

Prior art has failed to solve this problem. Although there have been tweezer style probe pairs that are designed to be held with one hand, they are small, designed for taking very closely spaced readings on printed circuit boards and are not designed to separate into two separate probes when needed. Furthermore, the tweezer style probes normally have a maximum separation of less than one inch, severely limiting the types of readings they can take.

In this invention, the probe tip distance between the probe pairs can be varied from touching each other to several inches apart when operated in the joined mode; and, when the distance between measuring points exceeds the available several inches that the joined probes can be spread apart, then, the joined probes can be separated into two separate probes to reach test points up to several feet apart as is often the case in a large industrial electrical panel.

BRIEF SUMMARY OF THE INVENTION

This invention affords an electrician or electrical technician the choice of joined test probes, operable with one hand or two separate unjoined test probes, operable with one probe in each hand. This versatility is accomplished by means of interlocking ends on each test probe. The interlocking ends are designed to be joined and unjoined with a minimum of time and effort. Two styles of interlocking ends would accomplish this. The less expensive style comprises a bar and slot that can mate or join when the bar and slot are aligned. The more expensive style incorporates a push button, quick-release pin and sleeve mechanism that allows the probes to be joined or unjoined at any position within the normal operating angle, thus permitting joining or unjoining with minimum time and effort.

BRIEF DESCRIPTION OF THE SEVERAL VIEWS OF THE DRAWING

FIG. 1 shows the probes interlocked in the joined position taking an electrical reading with the probes close together and taking an electrical reading with the probes spread further apart.

FIG. 2 shows the probes in the unjoined or non-interlocked position, thus permitting the taking of an electrical reading of two points far apart, the two probes being able to be moved independently of one another when in the unjoined state.

DETAILED DESCRIPTION OF THE INVENTION

Figure 1:
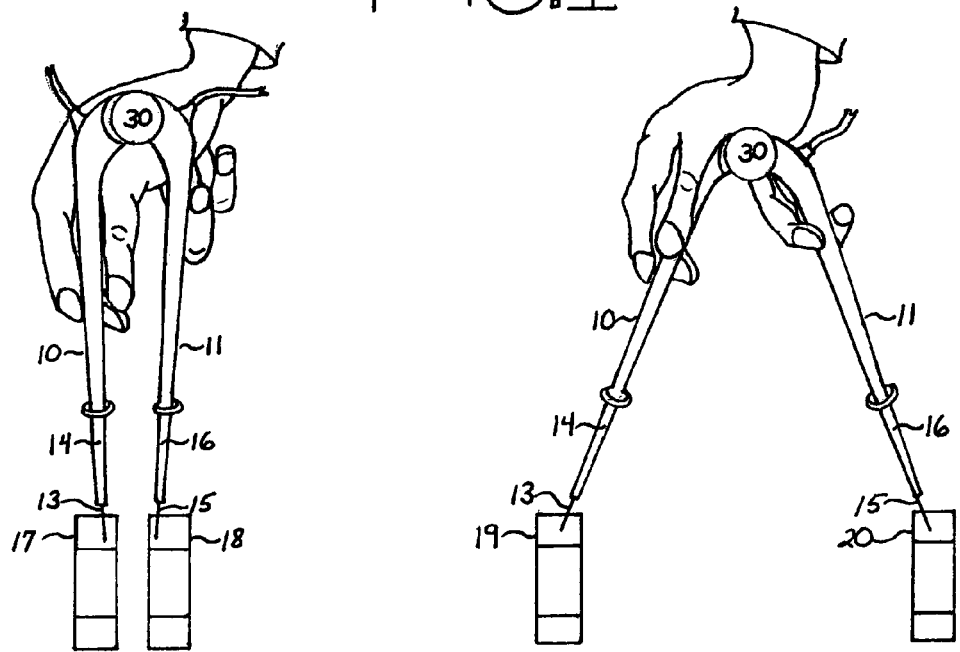
FIG. 1 is a perspective view of the interlocking electrical test probes of the invention used to sample an electrical signal from test points and convey that signal to a meter.

Referring to FIG. 1, a pair of interlocking electrical test probes shown in the joined state at interlocking joint 30; comprising a first test probe 10 and a second test probe 11. First test probe 10 having a metallic pointed end 13, and an electrically insulated body 14. Second test probe 11 having a metallic pointed end 15, and an electrically insulated body 16. Metallic pointed end 13 shown contacting test point 17 and test point 19. Metallic pointed end 15 shown contacting test point 18 and test point 20. Test points 17 and 18 shown being closer together than test points 19 and 20. Test probes 10 and 11 thus being in a joined state but free to pivot about interlocking joint 30; allowing the distance between metallic points 13 and 15 to be varied.

Figure 2:
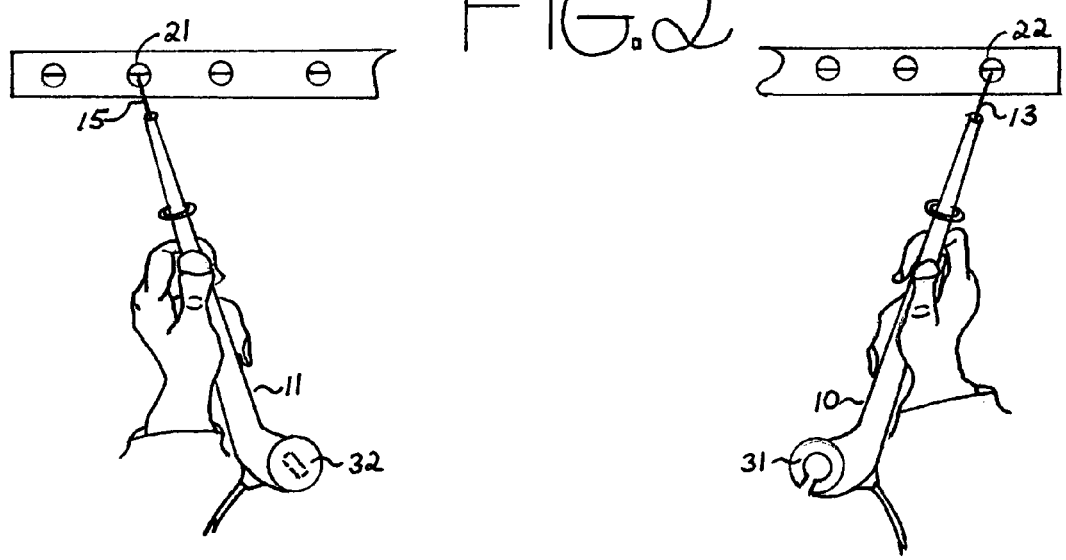
FIG. 2 is a perspective view of the interlocking electrical test probes of the invention used to sample an electrical signal from test points and convey that signal to a meter.

Referring to FIG. 2, shows test probes 10 and 11 in the unjoined state, thus being operable independently of one another. Metallic pointed end 13 shown contacting test point 22 and metallic pointed end 15 shown contacting test point 21. Test points 21 and 22 shown being much farther apart than test points 17 and 18 or 19 and 20 of FIG. 1. FIG. 2 also showing the bar half 32 of interlocking joint 30 of FIG. 1, and the slot half 31 of interlocking joint 30 of FIG. 1.

Figure 3:
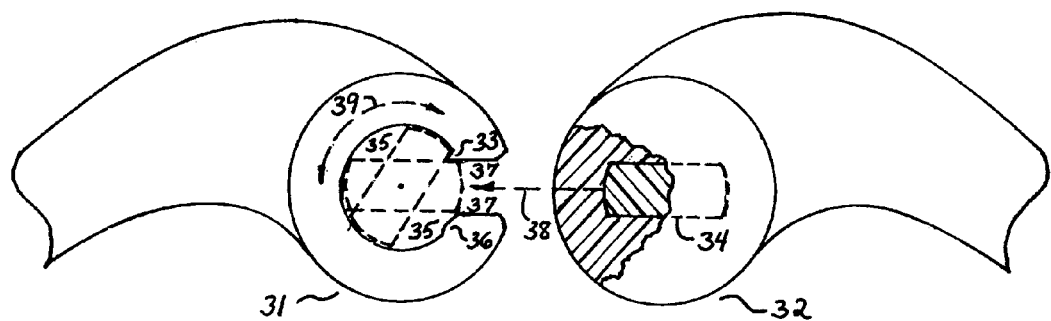
FIG. 3 is an enlarged view of the bar and slot interlocking ends.

Referring to FIG. 3 showing an enlarged and partially cut away view of slot half 31 and bar half 32 of interlocking joint 30 of FIG. 1. Arrow 38 of FIG. 3 showing the direction bar half 32 must move in order to join with slot half 31. FIG. 3 also showing stop ridge 33 which permits bar 34 to rotate in only the proper direction when slot half 31 and bar half 32 are first joined together; stop ridge 33 also limiting the amount of rotation that bar 34 can pivot in circular hole 35. Arrow 39 indicating the allowable, relative movement of bar half 32 and slot half 31 when they are in the joined state. FIG. 3 also showing start bump 36 which provides added friction to the pivoting motion of bar 34 at the start of rotation of slot half 31 and bar half 32 when first joined, and at the end of rotation of slot half 31 and bar half 32, just before their separation where bar 34 leaves circular hole 35 and exits through opening slot 37.

Figure 4:
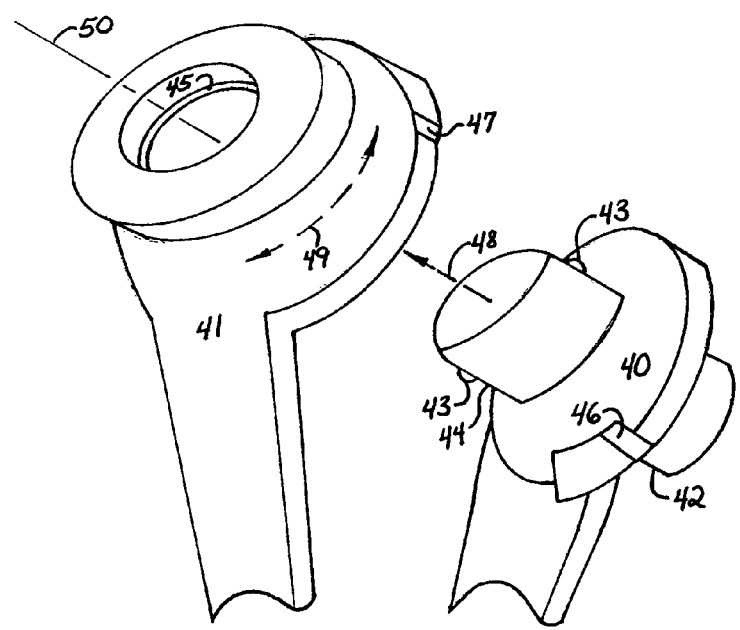
FIG. 4 is an enlarged view of the pushbutton, quick-release pin and sleeve interlocking ends.

Referring to FIG. 4 showing an enlarged view of a pushbutton quick-release pin 40 and a mating cylindrical receptacle 41, such that when push button 42 is pressed inward, spring loaded balls 43 retract into spindle 44, thus allowing spindle 44 to be inserted into mating cylindrical receptacle 41, indicated by direction arrow 48; such that when push button 42 is released, spring loaded balls 43 engage inner groove 45, thus locking together pin 40 and receptacle 41. In this locked or joined state, pin 40 is allowed to pivot or rotate within cylindrical receptacle 41, indicated by direction arrow 49; the degree of rotation permissible about center axis 50 being limited by interfering edges 46 and 47.

While there has been shown and described preferred embodiments of the interlocking electrical test probes of this invention, it is understood that changes in materials, sizes, shapes and colors can be made by those skilled in the art without departing from the invention. The invention is defined in the following claims.

I claim:

1. A pair of interlocking electrical test probes used to take electrical readings in an electrical circuit comprising a first test probe and a second test probe; said first test probe and said second test probe each having a metallic or similarly electrically conductive probe end to contact said electrical circuit; said first test probe and said second test probe each having an electrically insulated body to enable safe holding of said first test probe and said second test probe; said first test probe and said second test probe each having an interlocking end, with said interlocking end of said first test probe mating with said interlocking end of said second test probe; with said interlocking ends comprising: an opening slot in an end of said first test probe; said slot opening into a circular hole in said end of said first test probe; and a mating bar in an end of said second test probe; whereby said mating bar slides through said slot into said circular hole thereby interlocking said ends, the interlocked ends being operable to pivot, thereby enabling said pair of interlocking electrical test probes to pivot about said interlocked ends; said pair of interlocking electrical test probes thus enabled to become a joined pair of electrical test probes by means of said interlocking end of said first test probe being interlocked with said interlocking end of said second test probe thereby forming an interlocked joint; said joined pair of electrical test probes thus enabled to pivot about said interlocked joint thereby enabling said joined pair of electrical test probes to be operable with one hand; also, said pair of interlocking electrical test probes enabled to be an unjoined pair of electrical test probes thus enabling separate and independent motion of said first test probe with respect to said second test probe, said pair of interlocking electrical test probes thus being operable with two hands.

2. The pair of interlocking electrical test probes of claim 1 wherein said circular hole contains a stop ridge and a start bump; whereby said stop ridge allows said mating bar to pivot only in the correct direction once said interlocked ends are joined, said stop ridge also limiting the range of rotation said interlocked ends are allowed to pivot; said start bump providing added friction or resistance to rotation of said interlocked ends, thus warning an operator that further rotation towards opening said interlocked ends will permit said mating bar to enter said slot opening allowing said interlocked ends to become disjoined.

* * * * *